US006839292B2

(12) United States Patent
Gatzemeier et al.

(10) Patent No.: US 6,839,292 B2
(45) Date of Patent: Jan. 4, 2005

(54) APPARATUS AND METHOD FOR PARALLEL PROGRAMMING OF ANTIFUSES

(75) Inventors: Scott N. Gatzemeier, Boise, ID (US); Wallace E. Fister, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 10/023,280

(22) Filed: Dec. 14, 2001

(65) Prior Publication Data

US 2003/0112693 A1 Jun. 19, 2003

(51) Int. Cl.$^7$ ................................................ G11C 7/00
(52) U.S. Cl. ................................ 365/200; 365/225.7
(58) Field of Search ........................... 365/189.05, 200, 365/201, 230.03, 230.08, 225.7

(56) References Cited

U.S. PATENT DOCUMENTS

| | | | | |
|---|---|---|---|---|
| 5,936,908 A | * | 8/1999 | Loughmiller et al. | 365/225.7 |
| 5,978,298 A | * | 11/1999 | Zheng | 365/225.7 |
| 6,009,029 A | * | 12/1999 | Sher | 365/201 |
| 6,097,644 A | * | 8/2000 | Shirley | 365/200 |
| 6,172,935 B1 | * | 1/2001 | Wright et al. | 365/230.08 |
| 6,339,559 B1 | * | 1/2002 | Bertin et al. | 365/225.7 |
| 6,424,584 B1 | * | 7/2002 | Seyyedy | 365/225.7 |
| 6,430,101 B1 | * | 8/2002 | Toda | 365/225.7 |

* cited by examiner

Primary Examiner—Trong Phan
(74) Attorney, Agent, or Firm—Dorsey & Whitney LLP

(57) ABSTRACT

A method and apparatus for programming programmable elements of a plurality of memory devices in parallel. Each of the memory devices include an address latch for latching an address corresponding to a programmable element to be programmed and logic circuitry for receiving address load commands. The logic circuitry provides control signals to the address latch in response to receiving the load commands to cause the address latch to latch an corresponding to a programmable element to be programmed. By using the address latch and logic circuitry, the programming of a programmable element of a first memory device and the programming the second programmable element of a second memory device can occur in parallel.

29 Claims, 8 Drawing Sheets

| SCRAM RAM | | | DQ SYM DATA | | | | |
|---|---|---|---|---|---|---|---|
| | | | DUT 0<br>0123 | DUT 1<br>0123 | ... | DUT 31<br>0123 | DUT 63<br>0123 |
| BANK<br>FUSE | ADDR<br>ADDR | DUT 0<br>DUT 0 | 1000<br>1010<br>0000<br>0000 | 0000<br>0000<br>1000<br>1010 | ⋮<br>⋮<br>⋮<br>⋮ | 0000<br>0000<br>0000<br>0000 | 0000<br>0000<br>0000<br>0000 |
| BANK<br>FUSE | ADDR<br>ADDR | DUT 1<br>DUT 1 | | | | | |
| . . . | | | | | | | |
| BANK<br>FUSE | ADDR<br>ADDR | DUT 31<br>DUT 31 | 0000<br>0000 | 0000<br>0000 | ⋮<br>⋮ | 1000<br>1010 | 0000<br>0000 |
| . . . | | | | | | | |
| BANK<br>FUSE | ADDR<br>ADDR | DUT 63<br>DUT 63 | 0000<br>0000 | 0000<br>0000 | ⋮<br>⋮ | 0000<br>0000 | 1000<br>1010 |

*Fig. 5*

APPARATUS AND METHOD FOR PARALLEL PROGRAMMING OF ANTIFUSES

TECHNICAL FIELD

The present invention relates generally to the computer memory field, and more particularly, to the programming of programmable devices, such as antifuses, of memory devices.

BACKGROUND OF THE INVENTION

To determine the functionality of memory devices, the memory devices are typically tested. One type of test that is usually performed during testing determines whether any of the memory cells of a memory array fail to store data properly. If defective memory cells are detected, redundant memory included in the memory device may be used for replacement of the defective cells. The addresses corresponding to the defective memory cells are remapped such that data is written to and read from the redundant memory cells. The redundant memory is commonly arranged in banks, and remapping of the defective memory to a bank of redundant memory is accomplished by programming antifuses that control access to the redundant bank of memory. The antifuses are typically arranged in fuse bank regions, where the antifuses of a fuse bank region are associated with the banks of redundant memory for a region of the memory array.

FIG. 1 illustrates a flow diagram of a conventional method for programming antifuses of a memory device. A redundancy analyzer (RA) solution is calculated based on the location of any defective memory that is determined during testing at a step 102. Generally, the RA solution provides a solution for efficient use of the redundancy memory that is available on the memory device to replace the defective memory locations. The RA solution is then translated into bank and fuse addresses corresponding to the antifuses that should be programmed to remap defective memory locations to the redundancy memory that was calculated by the RA solution at a step 104. The bank and fuse addresses are stored programmatically in a fuse address array. Typically, the fuse address array is stored by the tester performing the testing. Conceptually, along one axis of the fuse address array is a list of the fuse identification (ID) of every possible antifuse on a memory device, and along a second axis is every memory device for a group of devices. The group of devices may be all of the memory devices of a single wafer, or all of the memory devices of a single lot of wafers. As a result of storing the data in the fuse address array, the particular antifuses that need to be programmed for each of the memory devices of the group is available for reference.

In programming the antifuses of the memory devices of the group, a subset of the group that includes several memory devices are positioned for programming by a tester. The term "touchdown" is commonly used to refer to each time a set of devices is positioned for programming. Each of the devices is positioned within a DUT of the tester, which stands for "device under test." The term DUT is often used to refer to one of the positions available within the tester per touchdown. The number of DUTs available per touchdown ranges from one to more than 128, and the number is continually increasing as tester capabilities improve. Each of the DUTs includes contact terminals to electrically contact signal pins of the memory device when the memory device is positioned within the DUT. It is through the contact terminals that signals can be applied to the memory device for testing and programming. Signals that are typically applied to each device include control signals, address signals, clock signals, and data signals. It will be appreciated, however, that greater or fewer signals may be applied will depend on the particular device being programmed or tested.

In many conventional memory testers, the address signals provided to all the DUTs of a tester are the same and cannot be individually programmed. However, in the case of input/output (I/O) signals, a small vector memory (SVM) is provided for each DUT, and each SVM can be programmed such that unique I/O signals can be provided to each device.

In going through the process of programming the antifuses of the devices of each touchdown as shown in FIG. 1 at steps 106–110, the tester sequences through the list of the fuse IDs of the fuse address array. For each fuse ID, the tester evaluates the stored information to determine if any of the devices in the touchdown need the antifuse corresponding to the current fuse ID to be programmed. If none of the devices require programming of the antifuse, then the tester continues to the next fuse ID. However, at a step 112, if any one of the devices in the touchdown need the antifuse corresponding to the current fuse ID to be programmed, then the SVM for each DUT having a device in need of antifuse programming is programmed with a data value indicative of the bank address of the antifuse that needs to be programmed. For those devices in the touchdown that do not need the antifuse corresponding to the current fuse ID to be programmed, a null value is provided to the respective data pins instead.

The fuse address of the antifuse to be programmed is commonly applied to the address terminals of each of the DUTs as in step 114. For those devices receiving a null data value, the fuse address has no effect. However, for the devices also receiving a data value indicative of a particular fuse bank, the application of the fuse address triggers a fuse blow event that programs the antifuse corresponding to the bank address applied to the data pins of the device and the fuse address applied to the address pins of the device as in step 116. The fuse address must be held valid throughout the entire duration of the fuse blow event, otherwise, the fuse blow event is terminated and the antifuse will not be programmed.

Upon completion of the fuse blow event, at a step 118, the tester continues to the next fuse ID of the fuse address array, and the process of determining whether any of the devices in the touchdown require programming of the antifuse of the current fuse ID, and programming thereof if at least one device requires it, continues until all of the possible antifuses of the memory device are checked.

When using the conventional antifuse programming process, the time required for programming the memory devices of a touchdown is roughly the product of the time for a fuse blow event to be setup and completed and the number of unique antifuses that need to be programmed for all of the devices in the touchdown. The previously described antifuse programming process represents a significant portion of the total test time, and thus, it is desirable to reduce the time spent on testing or programming antifuses to increase test throughput. Therefore, there is a need for an apparatus and method that can reduce the time spent on programming antifuses.

SUMMARY OF THE INVENTION

The present invention is directed to an apparatus and method for parallel programming programmable elements of a plurality of memory devices. Each of the memory devices have at least a first and second programmable element, such as antifuses. The memory device further has external address terminals and an array of memory with redundant memory to replace defective memory cells. The defective memory cells are replaced with redundant memory according to the programmed programmable elements. Included in the memory device is an address latch for latching an address corresponding to a programmable element to be programmed and logic circuitry coupled to the address latch. The logic circuitry receives address load commands and provides control signals to the address latch in response to receiving the load commands to cause the address latch to latch an address applied to the external address terminals as the address corresponding to a programmable element to be programmed. Programming circuitry coupled to the address latch and at least a portion of the programmable elements perform a programming event to program the programmable element corresponding to the latched address. The method includes programming the first programmable element of a first memory device of the plurality and programming the second programmable element of a second memory device of the plurality. The programming of the first and second programmable elements overlap for at least some period of time.

BRIEF DESCRIPTION OF THE DRAWINGS

FIG. 5 is a diagram of the organization of address data in a memory according to an embodiment of the present invention.

DETAILED DESCRIPTION OF THE INVENTION

Embodiments of the present invention provide an apparatus and method for reducing the total time for antifuse programming by programming antifuses for each device for a touchdown in parallel. That is, embodiments of the present invention allow for the possibility of a different antifuse to be programmed for each different devices of a touchdown concurrently or nearly concurrently. As a result, the antifuse programming time per touchdown is reduced to approximately the product of the time for a fuse blow event to be setup and completed and the number of antifuses that need to be programmed on the device in need of the most antifuse programming in that touchdown. Compare that to the time for antifuse programming using the conventional programming process, where the programming time per touchdown, as previously mentioned, is the product of the time for a fuse blow event to be setup and completed and the total number of unique antifuses that need to be programmed for all of the devices in the touchdown. By programming the antifuses of the device per touchdown in parallel, significant time savings can be realized.

Figure 1:
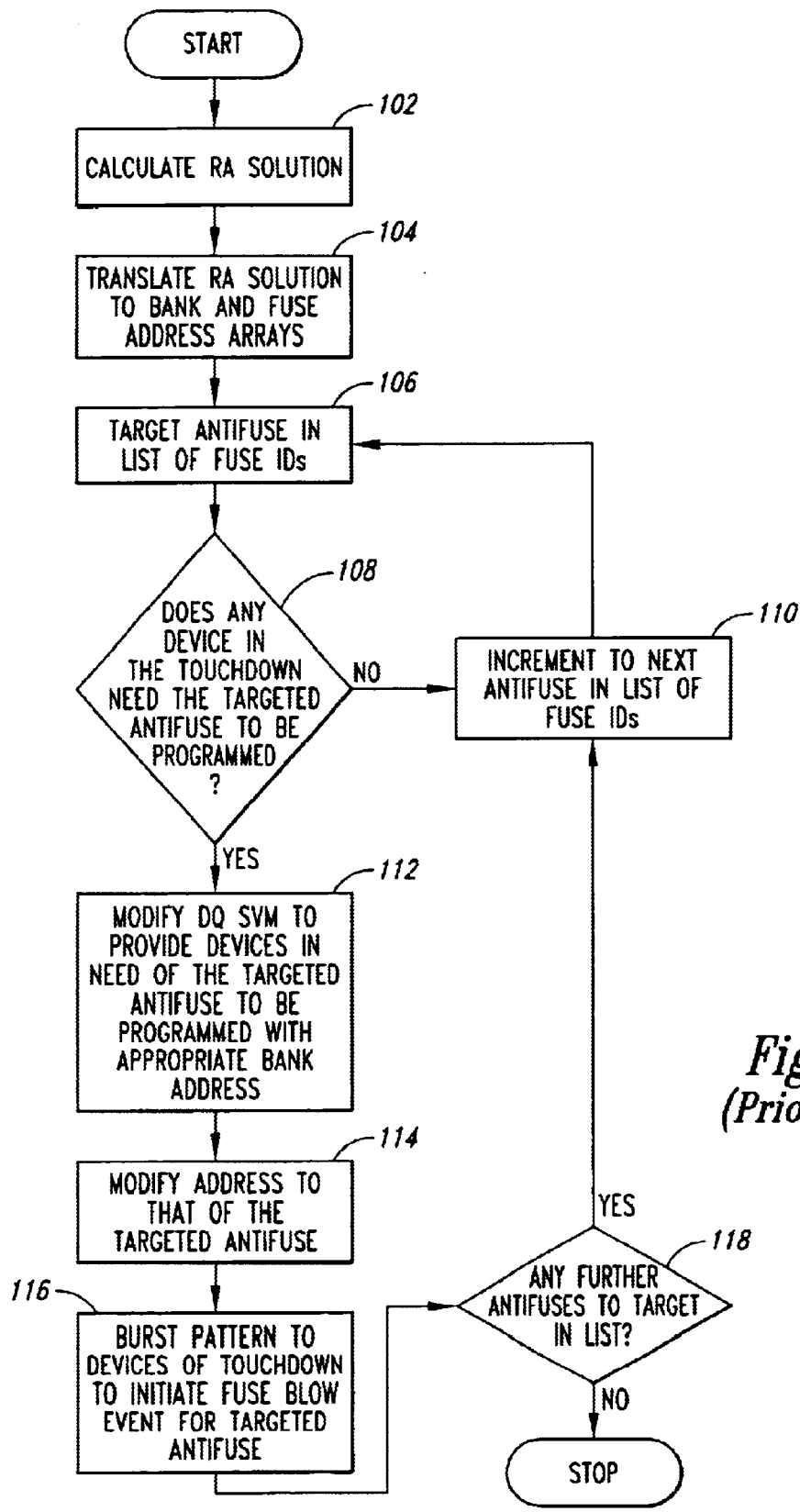
FIG. 1 is a flow diagram of a conventional antifuse programming process.
Figure 2:
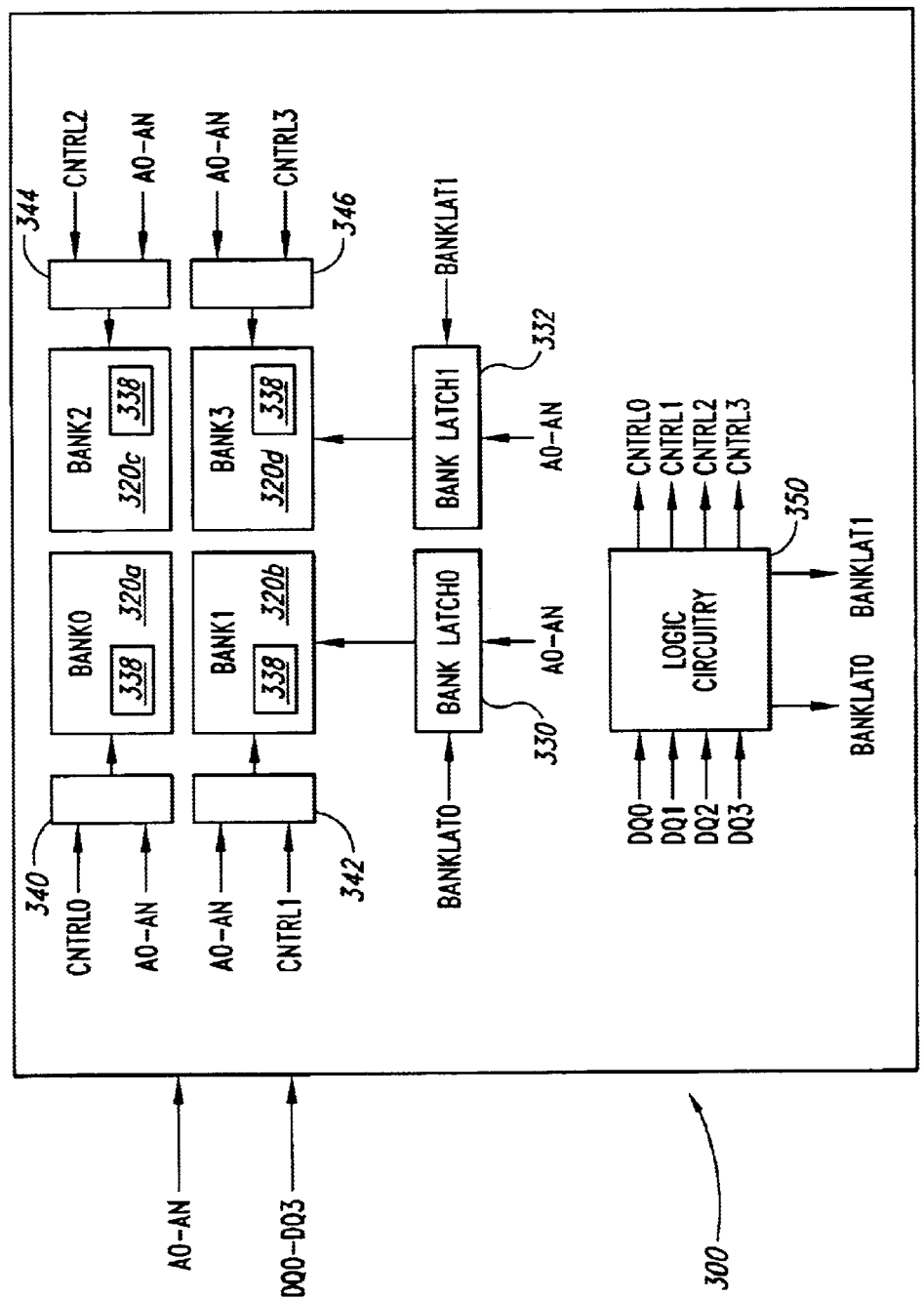
FIG. 2 is a block diagram of a portion of a memory device according to an embodiment of the present invention.

FIG. 2 illustrates a portion of a memory device 300 according to an embodiment of the present invention. The memory device 300 is similar to the conventional memory device, and such conventional elements have not been shown in order to avoid obscuring the present invention. For example, the memory device 300 includes a memory array (not shown) having conventional redundant memory used to replace defective memory cells of the array. As with a conventional memory device, remapping of defective memory cells to the redundant memory is accomplished by programming a programmable device, such as an antifuse. Conventional antifuse programming circuitry 338 is used for programming of the antifuses. In the present embodiment, the memory array is divided into four array regions, each of which has a fuse bank region associated therewith. The four fuse bank regions 320a, 320b, 320c, and 320d are shown in FIG. 2. Within each of the fuse bank regions are antifuses that can be programmed to replace defective memory cells of the associated memory array with the redundant memory. The antifuses can be uniquely identified by a bank address and a fuse address, and when programming of the antifuses takes place, the bank and fuse address are used to identify the antifuse that needs to be programmed. Programming of the antifuses in the four fuse bank regions 320a–320d is conventional and known to those ordinarily skilled in the art.

Although the memory device 300 includes many aspects that are conventional, the memory device 300 is different in that it includes bank address latches 330, 332, and fuse address latches 340, 342, 344, 346, and logic circuitry 350 to enable parallel antifuse programming according to embodiments of the present invention. The bank address latches 330, 332, and the fuse address latches 340, 342, 344, and 346, are coupled to receive address signals A0–An from the external address terminals of the memory device 300. The logic circuitry 350 is coupled to external data terminals DQ0–DQ3, to receive command signals, and is further coupled to the bank address latches 330, 332 and the fuse address latches 340–346. As will be explained in more detail below, when the memory device 300 is in an antifuse programming mode, command signals can applied to the memory device 300 via data terminals DQ0–DQ3 to instruct the loading of an address applied to the address terminals A0–An into either the bank address latches 330, 332, or the fuse address latches 340, 342, 344, 346. The logic circuitry 350 receives the command signals on DQ0–DQ3, and in response, generates BANKLAT0 and BANKLAT1 signals to instruct the bank latches 330, 332 to latch an antifuse bank address from the external address terminals, and generates signals CNTRL0–CNTRL3 to instruct the fuse address latches 340–346 to latch an antifuse address from the external address terminals. The latched bank and antifuse addresses are then provided to the respective banks 320a–320d to uniquely select an antifuse for programming. As shown in FIG. 2, conventional antifuse programming circuitry 338 is included for programming antifuses of the antifuse banks 320a–320d, as is well known.

It will be appreciated that the memory device 300 includes additional conventional circuitry that has not been shown in FIG. 2. These circuits are well known in the art, and consequently, will not be discussed herein for the sake of brevity. However, the description provided herein is sufficient to enable those of ordinary skill in the art to practice the invention. An alternative memory device suitable for use in embodiments of the present invention is described in more detail in co-pending U.S. patent application Ser. No. 09/810,366 to Cowles, entitled CIRCUIT AND METHOD FOR TEST AND REPAIR and filed Mar. 15, 2001, which is incorporated herein by reference.

Provided below is an example of command codes that can be used for loading bank and fuse addresses into the respective latches of the memory devices when set in the antifuse programming mode:

| Data Value (Hex) for DQ3-DQ0 | Function |
| --- | --- |
| 0 | Load Nothing |
| 1 | Load Bank Address Banks 0 and 1 |
| 2 | Load Bank Address Banks 2 and 3 |
| 5 | Load Fuse Address Bank 0 |
| 6 | Load Fuse Address Bank 2 |
| 9 | Load Fuse Address Bank 1 |
| a | Load Fuse Address Bank 3 |

Based on these commands, the bank and fuse address latches included in the memory device 300 can be loaded with the appropriate bank and fuse addresses by applying the bank or fuse address to the address terminals A0–An and issuing the appropriate load command through the DQs. As a result, each memory device of a touchdown can latch unique bank and fuse addresses and have a different antifuse programmed during a fuse blow event.

As will be described with respect to FIGS. 4 and 5, although a tester performing the antifuse programming may be able to provide only a common address to all of the memory devices in a touchdown, the bank and fuse addresses of the antifuse that needs to be programmed in each memory device can be latched in the bank and fuse address latches of the respective memory device through the use of load commands applied to the DQs of the particular device.

Figure 3:
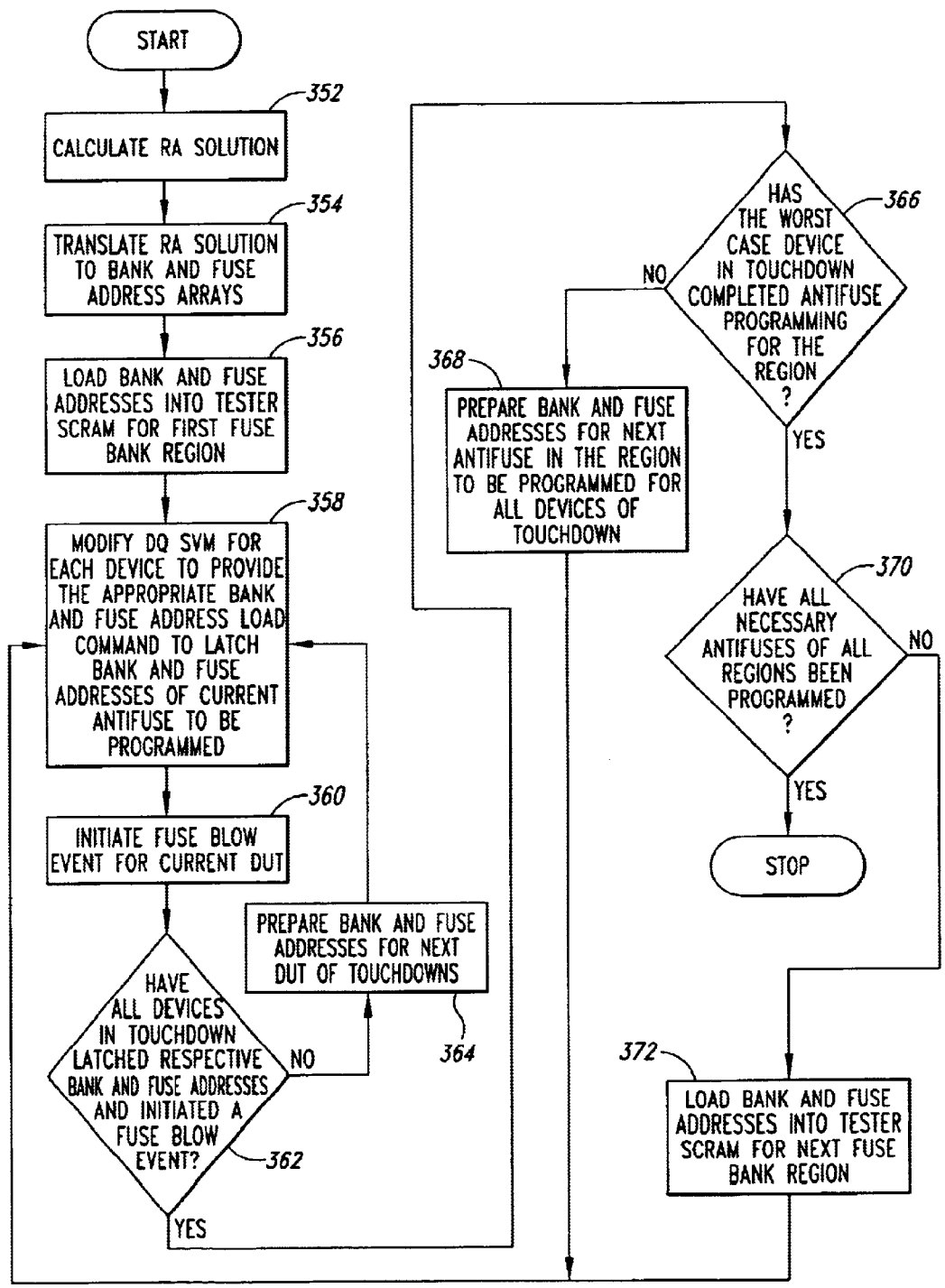
FIG. 3 is a flow diagram of an antifuse programming process according to an embodiment of the present invention.

FIG. 3 illustrates a flow diagram of an embodiment of the parallel antifuse programming process of the present invention. As with the conventional process, at a step 352, an RA solution is calculated based on the location of the defective memory cells and then at a step 354, translated into bank and fuse addresses corresponding to the antifuses that need to be programmed for each of the devices in a group. As previously mentioned, the group may be the devices on a single wafer, or the devices in a single lot of wafers. The bank and fuse address are stored in a data array as in the conventional process. However, in contrast with the conventional antifuse programming process, following the translation of the RA solution, the bank and fuse addresses of the antifuses for a first region of redundant memory of each device in a touchdown are loaded into a tester scramble memory SCRAM. In the present example that the antifuses for each device are programmed one fuse bank region at a time. However, it will be appreciated that the antifuse programming process can be performed for multiple regions at a time without departing from the scope of the present invention. FIG. 5 illustrates a table 500 that provides an example of the organization of the bank and fuse address data 502 and 504, respectively, stored in the tester SCRAM. Null values 506 are inserted into the bank and fuse addresses for the memory devices in the touchdown that do not require as many antifuses to be programmed. As will be explained in more detail below, this allows for the cycle of loading the bank and fuse addresses can be maintained for consistency during the fuse blow events. Although FIG. 5 illustrates an example of a suitable arrangement for the bank and fuse addresses, as well as the appropriate load commands to apply to the DQs of the devices in the touchdown, it will be appreciated that other arrangements can be used as well without departing from the scope of the present invention.

Following the loading of the bank and fuse addresses for the first fuse bank region into the tester SCRAM at a step 356, the process of having each memory device latch the respective bank and fuse address is carried out by programming the SVMs of each DUT in the touchdown to provide the appropriate load commands to the DQs of each of the memory devices. In the present example, loading of a respective bank and fuse address for each device of the touchdown is performed in sequence, with the sequence being repeated until all of the antifuses in the particular region for the worst case device are programmed as in steps 358–366. The antifuse programming process is then repeated for each of the remaining fuse bank regions until all of the antifuses of the memory devices have been programmed as in steps 368–372.

Figure 4:
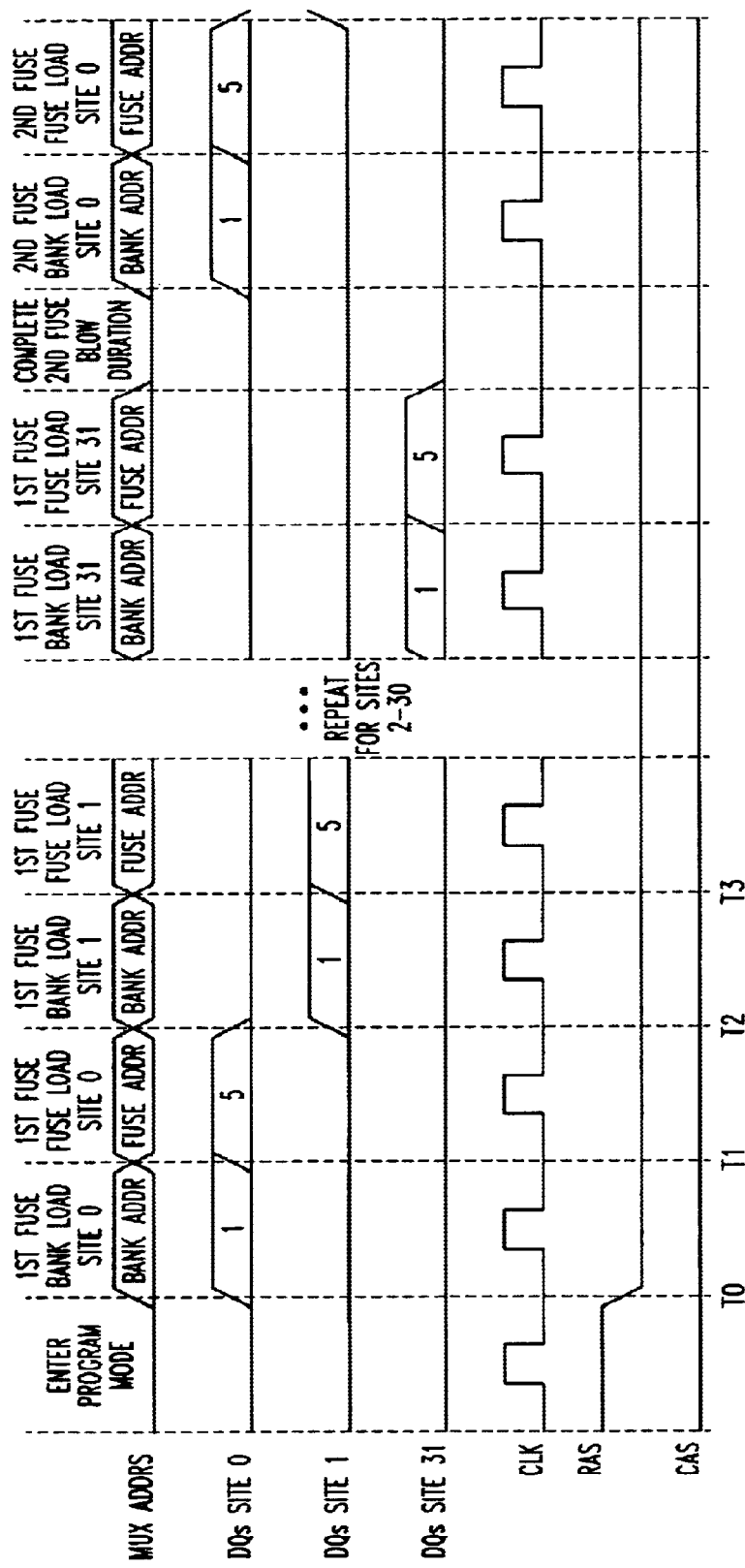
FIG. 4 is a timing diagram of various signals according to the antifuse programming process of FIG. 3.

FIG. 4 illustrates the timing of various signals that should be applied to the devices of a touchdown to load the respective bank and fuse addresses for fuse bank region 0. At a time T0, a 1H value applied to the DQs of the memory device at DUT0 initiates a Load Bank Address Banks 0 and 1 command. In response, the bank address provided to the address terminals of the memory device at DUT0 is latched into its bank address latch. The memory devices of all the other DUTs in the touchdown are provided a 0H value through the respective DQs to ignore the address that is being applied by the tester to the address terminals of all of the memory devices in the touchdown. It is necessary in this example to issue a 0H value to the DQs of all the DUTs other than DUT0 because recall that in the present example, the tester is capable of applying only one address to all of the DUTs at a given moment. Thus, since the bank address at T0 is intended for only the device at DUT0, it should be only that device which loads the bank address at that time.

At a time T1, the address applied to all of the DUTs of the touchdown is the fuse address corresponding to the first antifuse in fuse bank region 0 in need of programming for the memory device at DUT0. The fuse address is latched into the fuse address latch of the memory device at DUT0 by applying the value 5H to the DQs of that memory device to initiate a Load Fuse Address Bank 0 command. Upon latching the fuse address, the fuse blow event for the device at DUT0 is initiated to program the antifuse corresponding to the bank and fuse addresses latched at times T0 and T1, respectively. The value 0H is still provided to the DQs of all of the other devices of the touchdown to prevent them from loading of the fuse address for the device at DUT0.

After the bank and fuse addresses for the device at DUT0 have been loaded and the fuse blow event for that device has been initiated, the tester moves on to load the bank and fuse addresses for the device at DUT1 at times T2 and T3, respectively. Note that the fuse address does not need to be held valid throughout the fuse blow event for the memory device at DUT0 because the appropriate fuse address is latched in the fuse address latch of that device.

As with the memory device at DUT0, a 1H value applied to the DQs of the device at DUT1 initiates a Load Bank Address Banks 0 and 1 command at a time T2 to latch the address that is provided by the tester to the address terminals of all of the devices in the touchdown. At a time T3, a 5H value applied to the DQs of the device at DUT1 initiates a Load Fuse Address Bank 0 command to latch the fuse address and trigger the fuse blow event for that device to begin. Note that a 0H value is applied to the DQs of the devices other than at DUT1 to prevent the loading of either the bank or fuse addresses at times T2 and T3.

The process of loading the bank and fuse addresses into the latches of the memory devices of the touchdown is repeated for the remaining DUTs. As illustrated in the timing diagram of FIG. 4, it is assumed that there are 32 devices or DUTs per touchdown. As further illustrated in FIG. 4, following the loading of the bank and fuse address loading for the last DUT in the touchdown, it may be necessary to pause before continuing loading the bank and fuse addresses for the next antifuse to be programmed in order to allow for the fuse blow events for the first antifuse to complete.

Upon completing the programming of the first antifuse for each of the memory devices in the touchdown, the process of loading the bank and fuse addresses for the next antifuse that needs to be programmed on each device is started. The process begins again with the device at DUT0 and proceeds through each of the devices in the touchdown until all of the devices have loaded bank and fuse addresses. As previously mentioned, null values are provided to devices of the touchdown that are no longer in need of antifuse programming while waiting for the device in need of the most antifuse programming in the particular region.

When all of the fuses in the first region have been programmed, the SCRAM is then loaded with the bank and fuse addresses for the next fuse bank region. The previously described process is then repeated until all of the antifuses for that fuse bank region have been programmed. All of the antifuses for the remaining fuse banks regions are programmed in the same manner. As a result, the time it takes to program the antifuses for the touchdown is based on the memory device in need of the most antifuse programming.

An alternative embodiment of the present invention will be described with respect to FIGS. 6 and 7, and is directed to a tester having the capability of providing each device of a touchdown with unique address signals. This allows for the respective bank address and fuse address of each device to be loaded concurrently, thus, saving even more time than the previously described embodiment.

Figure 6:
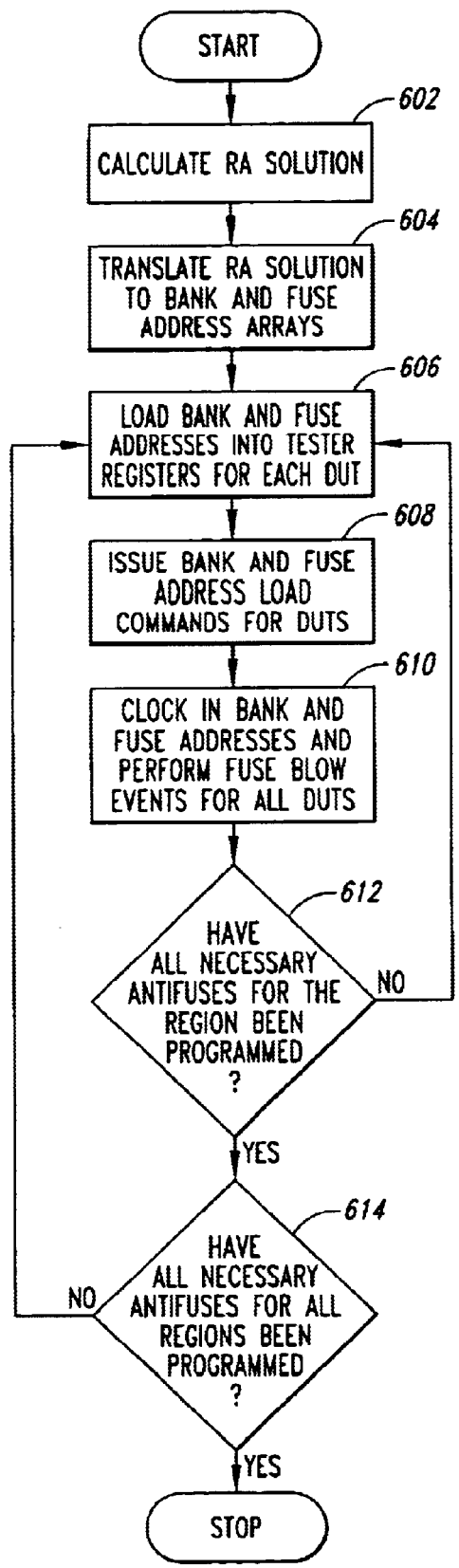
FIG. 6 is a flow diagram of an antifuse programming process according to another embodiment of the present invention.
Figure 7:
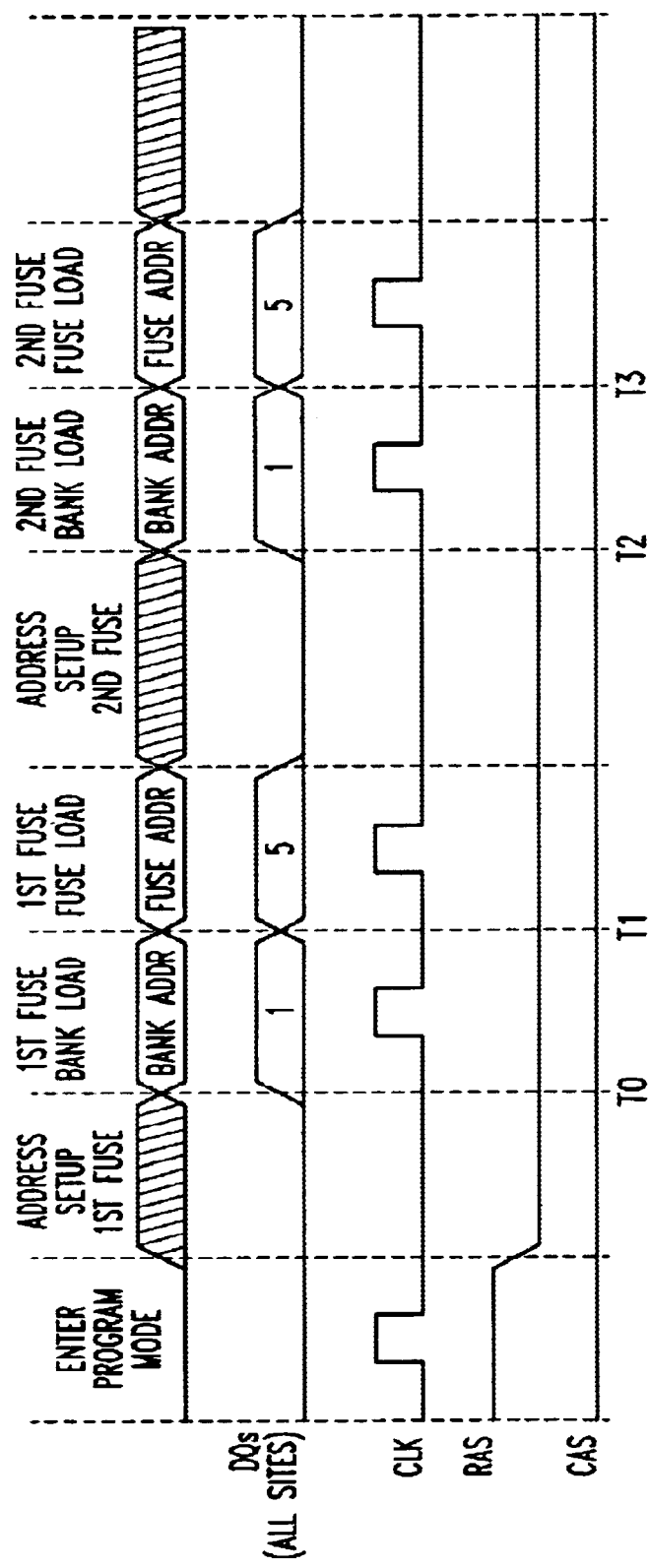
FIG. 7 is a is a timing diagram of various signals according to the antifuse programming process of FIG. 6.

FIG. 6 illustrates a flow diagram of a parallel antifuse programming process according to an alternative embodiment of the present invention. An RA solution is calculated at a step 602 based on the location of the defective memory cells and then translated into bank and fuse addresses corresponding to the antifuses that need to be programmed for each of the devices in a group at a step 604. The bank and fuse address are stored in a data array as in the conventional process. The tester then applies the appropriate signals to enable the antifuse programming mode for all the devices in a touchdown.

Recall that in the present embodiment, the tester is capable of providing unique addresses to each device in the touchdown. This feature is typically enabled through the use of data registers in the tester that are programmed with the unique bank and fuse addresses for each device. The tester will then apply to each device address signals corresponding first to the bank address, and then to the fuse address that are programmed in the data registers of the tester. Testers having these capabilities are well known in the art, and a more detailed explanation has been omitted from herein in the interest of brevity.

Following the entry into the antifuse programming mode, the bank and fuse addresses for the first antifuse in need of programming in each of the devices of the touchdown is loaded into the respective data registers for each of the DUTs at steps 606 and 608. As with the previous embodiment, the antifuses are programmed in a per fuse bank region basis. The timing diagram of FIG. 7 illustrates programming the antifuses of fuse bank region 0. A 1H value is applied to the DQs of all of the memory devices in the touchdown to initiate a Load Bank Address Bank 0 and 1 command, and at a time T0, each of the memory devices in the touchdown latches in the bank address applied to the respective address terminals. The tester then switches the address signals to provide the respective fuse address to each of the memory devices and changes the data value applied to the DQs to 5H to initiate a Load Fuse Address Bank 0 command. At a time T1, the respective fuse addresses are latched by each memory device and a fuse blow event is triggered for each of the memory devices as shown in FIG. 6 at step 610. While the fuse blow event is occurring, the bank and fuse addresses for next fuse in the region in need of programming for each memory device is programmed into the respective data registers. By programming the bank and fuse addresses for the next antifuse during the fuse blow event for the previous antifuse, the operation can essentially be hidden.

With the bank and fuse addresses for the next antifuse in the region programmed into the respective data registers, and a 1H value applied to the DQs of all of the devices in the touchdown, at a time T2 the respective bank address is latched by each device and the fuse blow event for the previous antifuse is terminated. The value provided to the DQs of all of the devices is modified to 5H to command the fuse address for fuse bank region 0 to be loaded, and the address signals applied to each of the memory devices is switched from the respective bank address to the respective fuse address. At a time T3, the devices latch the respective fuse addresses, and a fuse blow event is triggered to program the second antifuse in the region for each of the devices.

The process of loading the bank and fuse addresses into the respective data registers for the next antifuse to be programmed in the region for each individual device, latching the bank address, then latching the fuse address and triggering a fuse blow event to program the anti fuse corresponding to the respective bank and fuse addresses in each device, is repeated until all of the fuses in that region for the worst case device are programmed as shown in FIG. 6 in steps 606–612. As with the previously described embodiment, null values are provided to the devices having less antifuses in need of programming than the worst case memory device and that are waiting for the programming of those antifuses to be completed.

When programming of the antifuses for a region is completed, the process is repeated for the next region, and all remaining regions until all of the antifuses in need of programming for each device in the touchdown are programmed as shown in steps 606–614.

Although the embodiments herein have been described having 32 DUTs per touchdown, it will be appreciated that those of ordinary skill in the art have sufficient understanding to modify details provided herein to apply some or all of the principals of the present invention to touchdowns having more or less than 32 DUTs. Moreover, embodiments of the present invention have been described herein with respect to memory devices having antifuses arranged into fuse bank regions. However, it will be further appreciated that embodiments of the present invention can be modified such that they may be applied to memory devices have alternative antifuse arrangements without departing from the scope of the present invention.

Figure 8:
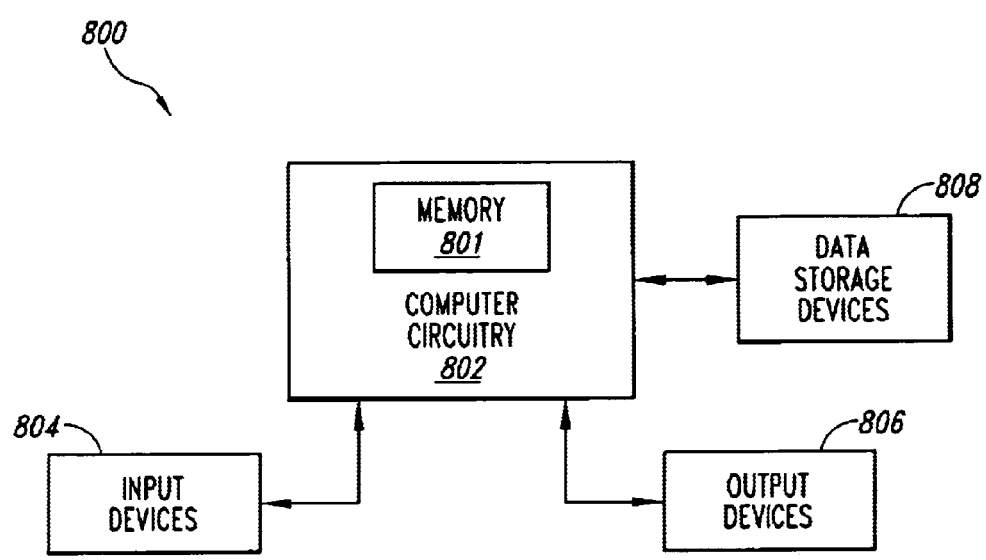
FIG. 8 is a block diagram of a computer system including a memory device of FIG. 2.

FIG. 8 is a block diagram of a computer system 800 including computing circuitry 802. The computing circuitry 802 contains a memory 801 that includes circuitry according to embodiments of the present invention. The computing circuitry 802 performs various computing functions, such as executing specific software to perform specific calculations or tasks. In addition, the computer system 800 includes one or more input devices 804, such as a keyboard or a mouse, coupled to the computer circuitry 802 to allow an operator to interface with the computer system. Typically, the computer system 800 also includes one or more output devices 806 coupled to the computer circuitry 802, such output devices typically being a printer or a video terminal. One or more data storage devices 808 are also typically coupled to the computer circuitry 802 to store data or retrieve data from external storage media (not shown). Examples of typical storage devices 808 include hard and floppy disks, tape cassettes, and compact disc read-only memories (CD-ROMs). The computer circuitry 802 is typically coupled to the memory device 801 through appropriate address, data, and control busses to provide for writing data to and reading data from the memory device.

As previously discussed, the memory device in the present example is assumed to have four regions, or four banks of redundant memory. However, it will be appreciated that having greater or fewer regions of redundant memory is a detail that can be modified without departing from the scope of the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for programming programmable elements of a plurality of memory devices, each memory device having at least a first and second programmable element thereon, the method comprising:

programming the first programmable element of a first memory device of the plurality of memory devices; and programming the second programmable element of a second memory device of the plurality of memory devices, the programming of the first and second programmable elements overlapping at least for a period of time.

2. The method of claim 1 wherein the programming of the first and second programmable elements occur substantially concurrently.

3. The method of claim 1 wherein the programming of the first and second programmable elements occur substantially sequentially.

4. The method of claim 1 wherein programming of the first programmable element comprises:

providing bank and fuse addresses corresponding to the first programmable element;

latching the bank address;

latching the fuse address; and initiating a programming event in response to latching the fuse address to program the first programmable element.

5. The method of claim 4 wherein providing the fuse address ceases prior to the completion of the programming event.

6. The method of claim 1 wherein programming of the first programmable element comprises:

providing a bank address corresponding to an antifuse bank in which the first programmable element is located;

providing a first load command to latch the bank address;

providing a fuse address corresponding to the first programmable element;

providing a second load command to latch the fuse address; and initiating a programming event in response to latching the fuse address to program the first programmable element.

7. The method of claim 1 wherein the programmable element comprises an antifuse.

8. A method for programming programmable elements of a plurality of memory devices, comprising:

in a first memory device of the plurality of memory devices, latching a first address corresponding to a programmable element located at a first location on the memory devices;

initiating a programming event to program the programmable element in the first memory device located at the first location;

in a second memory device of the plurality of memory devices, latching a second address corresponding to a programmable element located at a second location on the memory devices; and before the completion of the programming event for the programmable element in the first memory device, initiating a programming event to program the programmable element in the second memory device located at the second location.

9. The method of claim 8 wherein the programming events for the programmable elements in the first and second devices occurs substantially concurrently.

10. The method of claim 8 wherein the programming events for the programmable elements in the first and second devices occurs substantially sequentially.

11. The method of claim 8 wherein latching the first address comprises:

the address latch is a first address latch and providing a first load command to the first memory device to latch the bank address;

providing a fuse address corresponding to the programmable element located at the first location; and providing a second load command to the first memory device to latch the fuse address.

12. The method of claim 11 wherein providing the fuse address corresponding to the programmable element located at the first location ceases prior to the completion of the programming event for the programmable element in the first memory device.

13. The method of claim 8 wherein the latching of the first address and the second address occur substantially simultaneously.

14. A method for programming programmable elements of a plurality of memory devices, comprising:

commanding a first of the memory devices to latch a first address corresponding to a programmable element located at a first location on the memory devices;

commanding a second of the memory devices to latch a second address corresponding to a programmable element located at a second location on the memory devices; and programming the programmable elements of the first and second of the memory devices substantially concurrently.

15. The method of claim 14 wherein the programming of the programmable elements of the first and second of the memory devices is initiated substantially simultaneously.

16. The method of claim 14 wherein the programming of the programmable elements of the first and second of the memory devices is initiated substantially sequentially.

17. The method of claim 14 wherein commanding the first and the second of the memory devices comprises simultaneously providing a load command to the first and second of the memory devices.

18. The method of claim 14 wherein commanding the first and the second of the memory devices comprises sequentially providing a load command to the first and second of the memory devices.

19. The method of claim 14, further comprising providing the first address and the second address to the first and second of the memory devices, respectively, substantially simultaneously.

20. A method for programming antifuses of a plurality of memory devices, comprising:

providing to a first memory device of the plurality an address corresponding to a programmable element to be programmed in the first memory device;

providing a load command to the first memory device to latch the address;

providing to a second memory device of the plurality an address corresponding to a programmable element to be programmed in the second memory device; and providing a load command to the second memory device to latch the address.

21. The method of claim 20 wherein providing a load command to the first memory device and providing a load command to the second memory device occur simultaneously.

22. The method of claim 20 wherein providing a load command to the first memory device and providing a load command to the second memory device occur sequentially.

23. The method of claim 20 wherein providing an address to the first memory device and providing an address to the second memory device occur simultaneously.

24. The method of claim 20 wherein providing an address to the first memory device and providing an address to the second memory device occur sequentially.

25. The method of claim 20 wherein providing an address to the first and second memory devices ceases prior to the completion of a antifuse programming event.

26. A memory device having external address terminals and data terminals, and further having an array of memory with redundant memory to replace memory cells therein, the memory device comprising:

an antifuse bank address latch coupled to the external address terminals for latching an antifuse bank address applied to the external address terminals corresponding to a bank of antifuses including a programmable element to be programmed by a programming event;

an antifuse address latch coupled to the external address terminals for latching an antifuse address applied to the external address terminals corresponding to the programmable element to be programmed by the programming event;

logic circuitry coupled to the address latch and the data terminals, the logic circuitry receiving antifuse bank and antifuse address load commands applied to the data terminals and providing control signals to the antifuse bank address latch and antifuse address latch in response to receiving the antifuse bank and antifuse address load commands to cause the antifuse bank address latch and the antifuse address latch to latch the respective addresses applied to the external address terminals as the antifuse bank and antifuse address corresponding to the programmable element to be programmed, all respectively; and programming circuitry coupled to the antifuse bank address latch and antifuse address latch and at least a portion of the programmable elements, the programming circuitry performing the programming event to program the programmable element corresponding to the latched antifuse bank and antifuse addresses.

27. A memory device having external address terminals and an array of memory with redundant memory to replace memory cells therein the memory device comprising:

a bank address latch for latching a bank address corresponding to an antifuse bank in which an antifuse to be programmed by a programming event is located;

a fuse address latch for latching an antifuse address corresponding to the antifuse to be programmed by the programming event; and logic circuitry coupled to the bank and fuse address latches, the logic circuitry receiving address load commands and providing control signals to the bank and fuse address latches in response thereto to cause the bank and fuse address latches to latch the bank and fuse addresses, respectively, applied to the external address terminals as the bank and fuse addresses corresponding to the antifuse to be programmed.

28. The memory device of claim 27, further comprising programming circuitry coupled to the bank and fuse address latches, the programming circuitry performing the programming event to program the antifuse corresponding to the latched bank and fuse addresses.

29. A computer system, comprising:

a data input device;

a data output device;

a processor coupled to the data input and output devices; and a memory device coupled to the processor, the memory device comprising:

external address terminals;

data terminals;

an array of memory with redundant memory to replace memory cells;

an antifuse bank address latch coupled to the external address terminals for latching an antifuse bank address applied to the external address terminals corresponding to a bank of antifuses including a programmable element to be programmed by a programming event;

an antifuse address latch coupled to the external address terminals for latching an antifuse address applied to the external address terminals corresponding to the programmable element to be programmed by the programming event;

logic circuitry coupled to the address latch and the data terminals, the logic circuitry receiving antifuse bank and antifuse address load commands applied to the data terminals and providing control signals to the antifuse bank address latch and antifuse address latch in response to receiving the antifuse bank and antifuse address load commands to cause the antifuse bank address latch and the antifuse address latch to latch the bank and antifuse addresses, respectively, applied to the external address terminals as the antifuse bank and antifuse address corresponding to the programmable element to be programmed, all respectively; and programming circuitry coupled to the antifuse bank address latch and antifuse address latch and at least a portion of the programmable elements, the programming circuitry performing the programming event to program the programmable element corresponding to the latched antifuse bank and antifuse addresses.

* * * * *

UNITED STATES PATENT AND TRADEMARK OFFICE
CERTIFICATE OF CORRECTION

PATENT NO. : 6,839,292 B2
DATED : January 4, 2005
INVENTOR(S) : Scott N. Gatzemeier and Wallace E. Fister It is certified that error appears in the above-identified patent and that said Letters Patent is hereby corrected as shown below:

Title page,
Item [56], References Cited, U.S. PATENT DOCUMENTS, insert the following:
-- 5,838,625     11/98   Cutter et al.    365/225.7
6,525,982 B1   02/03   Cowles        365/225.7 --
Item [57], ABSTRACT,
Line 8, reads "to latch an corresponding" should read -- to latch a corresponding --

Column 4,
Line 4, reads "each different devices of a" should read -- each different device of a --
Line 64, reads "signals can applied" should read -- signals can be applied --

Column 7,
Line 64, reads "fuse banks regions" should read -- fuse bank region --

Column 9,
Line 11, reads "the anti fuse" should read -- the antifuse --
Line 38, reads "devices have alternative" should read -- devices having alternative --

Column 12,
Line 27, reads "completion of a antifuse" should read -- completion of an antifuse --

Signed and Sealed this

Twenty-eighth Day of June, 2005

JON W. DUDAS
*Director of the United States Patent and Trademark Office*